(12) United States Patent
Martins (10) Patent No.: US 7,233,174 B2
(45) Date of Patent: Jun. 19, 2007

(54) DUAL POLARITY, HIGH INPUT VOLTAGE SWING COMPARATOR USING MOS INPUT TRANSISTORS

(75) Inventor: Marcus Marchesi Martins, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/894,196

(22) Filed: Jul. 19, 2004

(65) Prior Publication Data

US 2006/0012405 A1    Jan. 19, 2006

(51) Int. Cl.
*K03K 5/22* (2006.01)

(52) U.S. Cl. .......................... 327/65; 327/63; 327/68; 327/74; 330/125

(58) Field of Classification Search .................. 327/65, 327/63, 68, 74
See application file for complete search history.

(56) References Cited

U.S. PATENT DOCUMENTS

| | | | | |
|---|---|---|---|---|
| 4,401,901 A | * | 8/1983 | Ochi | ........................... 327/89 |
| 5,196,980 A | * | 3/1993 | Carson | ......................... 361/18 |
| 5,416,369 A | * | 5/1995 | Fong et al. | ................... 327/65 |
| 5,541,538 A | * | 7/1996 | Bacrania et al. | .............. 327/77 |
| 5,610,547 A | * | 3/1997 | Koyama et al. | ............ 327/350 |
| 5,942,921 A | * | 8/1999 | Talaga, Jr. | .................... 327/77 |
| 6,215,339 B1 | * | 4/2001 | Hedberg | ..................... 327/108 |
| 6,232,801 B1 | * | 5/2001 | Khoury et al. | ................ 327/57 |
| 6,346,832 B1 | * | 2/2002 | Young | ......................... 327/108 |
| 6,710,734 B2 | * | 3/2004 | Ono et al. | .................. 341/159 |
| 6,720,805 B1 | * | 4/2004 | Haas | .......................... 327/108 |
| 6,734,723 B2 | * | 5/2004 | Huijsing et al. | ............... 330/9 |
| 6,914,485 B1 | * | 7/2005 | Carroll | ....................... 330/258 |
| 2002/0030515 A1 | * | 3/2002 | Garnier | ....................... 327/63 |

* cited by examiner

*Primary Examiner*—Tuan T. Lam
*Assistant Examiner*—Hiep Nguyen
(74) *Attorney, Agent, or Firm*—W. James Brady, III; Frederick Jr. Telecky, Jr.; Dolly Y. Wu (57) ABSTRACT

A differential input comparator circuit comprises an input stage comprising dual polarity input voltages and an output stage adapted to output a differential voltage based on the input voltages, wherein the differential voltage is adapted to be transmitted to a comparator and wherein the circuit has high input impedance and works with high input voltage swings.

20 Claims, 9 Drawing Sheets

DUAL POLARITY, HIGH INPUT VOLTAGE SWING COMPARATOR USING MOS INPUT TRANSISTORS

FIELD OF THE INVENTION

The present invention relates to differential input comparators and, more particularly, to a differential input comparator using MOS input transistors, for dual polarity, high voltage swing applications.

BACKGROUND OF THE INVENTION

A comparator circuit typically receives two input signals and generates an output signal based on the comparison of the two input signals. The comparison is generally based on the amplitude or magnitude of the input voltages.

Various problems are associated with comparator circuits, in particular with the input stage of the comparator. For example, input voltage limitations exist. Such limitations are imposed by the voltage breakdown of PN junctions and gate oxides in an ordinary complementary MOS (CMOS) or bipolar CMOS (BiCMOS) fabrication process. Further, certain solutions to these problems associated with comparator circuits employ external components to the chip or make use of circuit configurations that lower the input impedance of the comparator.

It is the purpose of the present invention to overcome the problems described above and to provide means of comparing signals of high voltage amplitude and both voltage polarities while keeping the comparator high input impedance presented by the MOS input transistors.

SUMMARY OF THE INVENTION

The present invention achieves technical advantages as a differential input comparator using MOS input transistors, for dual polarity high input voltage swing applications and high input impedance.

In one embodiment, a differential input comparator circuit comprises an input stage comprising dual polarity input voltages and an output stage adapted to output a differential voltage based on the input voltages, wherein the differential voltage is adapted to be transmitted to a comparator and wherein the circuit has high input impedance and works with high input voltage swings.

In another embodiment, a method for comparing signals comprises receiving dual polarity input voltages, maintaining a high input impedance, converting the dual polarity input voltages to a single polarity output voltage and outputting the single polarity output voltage, based on the input voltages, to a comparator.

DETAILED DESCRIPTION OF THE INVENTION

Circuit Description

Figure 1A:
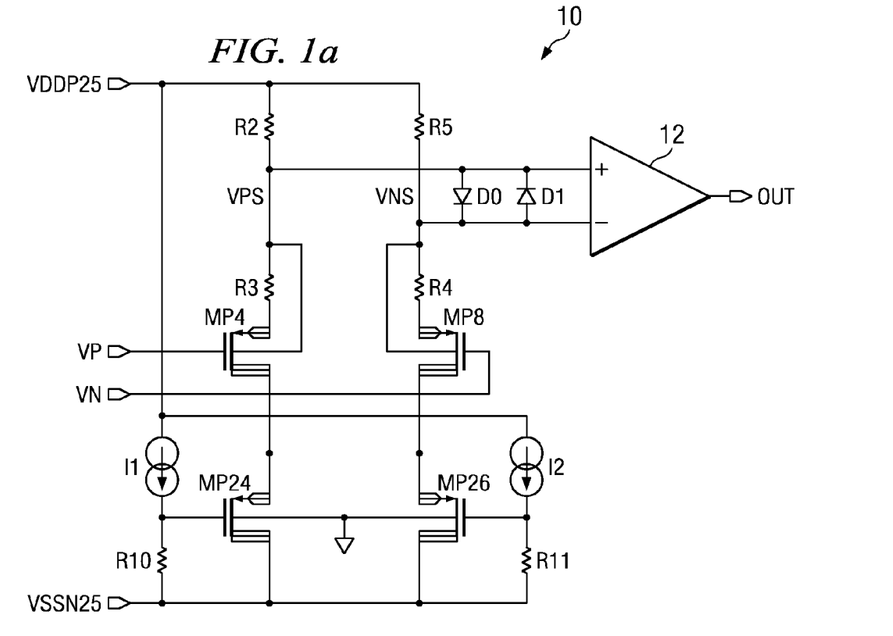
FIG. 1a illustrates a circuit in accordance with an exemplary embodiment of the present invention.

Referring now to FIG. 1a, a differential input comparator circuit 10 of the present invention includes an input stage that comprises positive Channel MOS (PMOS) transistors MP4, MP8, MP24, and MP26, resistors R2, R3, R4, R5, R10, and R11, diodes D0 and D1, current sources I1 and I2 voltage supplies VDDP25 and VSSN25, and a circuit ground node gnd. The output of this first stage is the differential voltage VPS-VNS which is applied to an ordinary comparator 12. Comparator 12 works only with single positive polarity signals so the first stage converts the dual polarity signals applied to VP and VN to positive voltages at VPS and VNS.

Resistor R2 is connected between supply voltage VDDP25 and the common node VPS of R2, R3, D0, D1, the N-well of transistor MP4, and the positive input of comparator 12. Resistor R3 is connected between the common node VPS and the source of PMOS transistor MP4. The gate of transistor MP4 is connected to differential input signal voltage VP. The well of transistor MP4 is connected to the common node VPS. The drain of transistor MP4 is connected to the source of PMOS transistor MP24. The drain of transistor MP24 is connected to supply voltage VSSN25. The well of transistor MP24 is connected to circuit ground gnd. The gate of transistor MP24 is connected to the common node A of resistor R10 and current source I1. Resistor R10 is connected between common node A and supply voltage VSSN25. Current source I1 is connected between supply voltage VDDP25 and the common node A.

Resistor R5 is connected between supply voltage VDDP25 and the common node VNS of R5, R4, D0, D1, the backgate (N-well) of transistor MP8, and the negative input of comparator 12. Resistor R4 is connected between the common node VNS and the source of PMOS transistor MP8. The gate of transistor MP8 is connected to differential input signal voltage VN. The N-well of transistor MP8 is connected to the common node VNS. The drain of transistor MP8 is connected to the source of PMOS transistor MP26. The drain of transistor MP26 is connected to supply voltage VSSN25. The substrate of transistor MP26 is connected to circuit ground gnd. The gate of transistor MP26 is connected to the common node B of resistor R11 and current source I2. Resistor R11 is connected between common node B and supply voltage VSSN25. Current source I2 is connected between supply voltage VDDP25 and the common node B. Transistors MP4 and MP8, and transistors MP24 and MP26 are drain extended symmetrical devices.

The anode of diode D0 is connected to common node VPS and the cathode of diode D0 is connected to the common node VNS. The anode of diode D1 is connected to common node VNS and the cathode of diode D1 is connected to the common node VPS. The comparator 12 has its positive input connected to the common node VPS and its negative input connected to the common node VNS.

By example only, the resistors R10 and R11 each have a resistance value of 110 k ohms and the resistors R2, R3, R4, and R5 each have a resistance value of 200 k ohms. The voltage source VDDP25 has a voltage of +25 volts referenced to circuit ground gnd and voltage supply VSSN25 has a voltage of −25 volts referenced to circuit ground gnd. Other values may also be used for the components of the circuit 10.

Circuit Operation

The differential input comparator circuit 10 of the present invention uses PMOS transistors as the differential input pair and has high input impedance, works in dual polarity input voltages (VP and/or VN can be positive or negative relative to ground gnd), and works with high input voltage swings. The circuit 10 also comprises various circuits that adjust the bias voltage of those PMOS devices according to the input voltages. Such adjustment keeps the devices within a safe area of voltage operation. The circuit 10 also does not use external components to adjust the bias voltage.

The two input voltages to be compared are applied to VP and VN and can be of any value. For the present embodiment, the minimum voltage that may occur is −25 volts, and the maximum voltage that may occur is +25 volts. In other embodiments, the minimum and maximum voltages may differ. So, both voltages applied to VP and VN can be zero volts, they can be both positive voltages, both negative voltages or one positive and other negative. Two distinct situations might occur. In the first one, the voltages on VP and VN are very close to each other (low overdrive voltage at the input) and in the second one VP and VN can assume voltage levels that are far apart.

Figure 2:
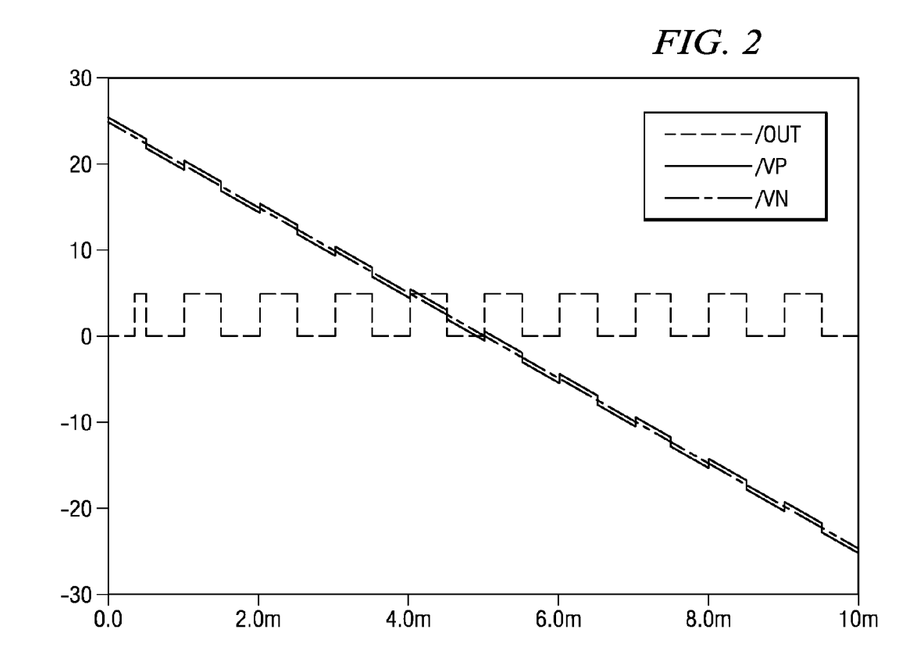
FIG. 2 illustrates a graph depicting the input signals VP, VN when they are very close to each other (low overdrive voltage at the input) and the comparator output voltage, in accordance with an exemplary embodiment of the present invention.

The situation where VP and VN are very close to each other is shown on FIGS. 2–6. FIG. 2 depicts the input signal VP toggling above and below input signal VN (which is a ramp) in close proximity to VN. The signal VOUT is the digital output of the comparator 12. VOUT is high (for example 5V) whenever VP is higher than VN and VOUT is low whenever VP is lower than VN. For applications where these input signals are very close to each other, they can certainly be compared.

Figure 3:
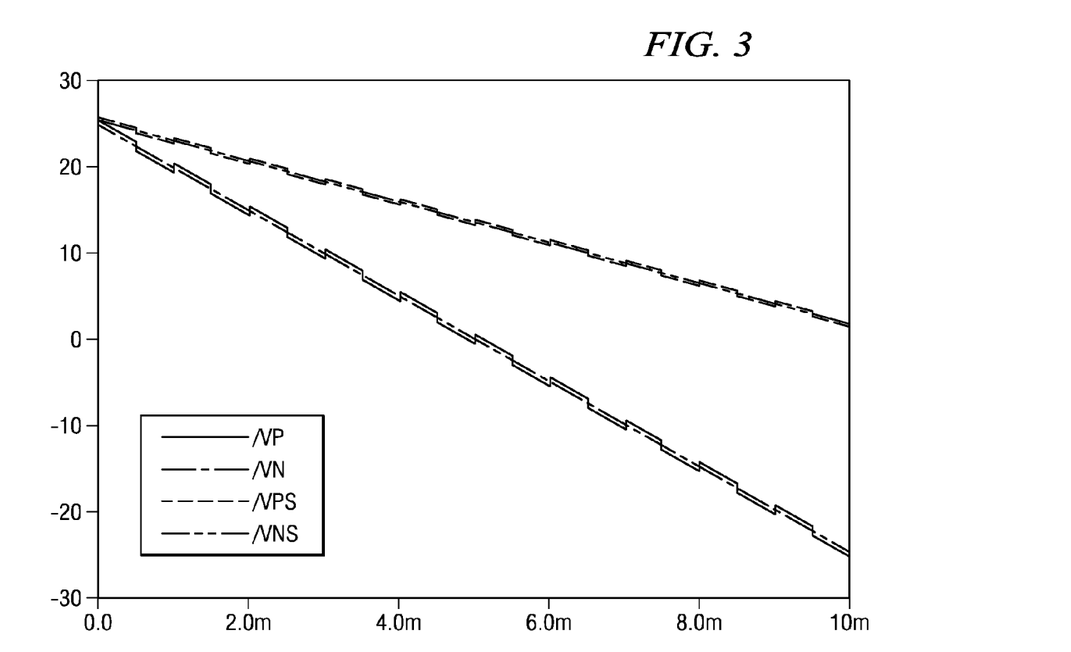
FIG. 3 illustrates a graph depicting input signals VP, VN when they are very close with each other, and the output voltages of the input stage VNS, VPS, which are always positive in accordance with an exemplary embodiment of the present invention.

The input voltage signal VP is applied to the gate of transistor MP4. MP4, R2 and R3 form a source follower circuit such that the voltage at the source of transistor MP4 will be a VGS voltage (approximately 1 to 3 volts) above VP and will follow (track) the voltage VP applied to the gate of MP4 and vary from +25 volts when VP is close to +25V to approximately −22V volts when VP is at −25V. The source of transistor MP4 is connected to the resistor R3 at node E. The resistors R2 and R3 are identical and are connected in series to act as a voltage divider. Since the voltages applied to VP and VN are close to each other, the output voltages of the first stage VPS and VNS will also be close to each other and no electrical current will flow through diodes D0 or D1. That way, the resistor divider formed by R2 and R3 will make the voltage on VPS to be half way between supply VDDP25 and the voltage on node E. The maximum voltage that may appear at node VPS is +25 volts when VP is +25 volts and the minimum voltage that may appear at node VPS is approximately +1.5 volts when VP is at −25 volts. The resistor divider is used to provide a positive voltage at VPS independent of the polarity of the input voltage VP. FIG. 3 depicts the dual polarity input voltages VP and VN and output signals VNS and VPS which are always positive. The nodes VNS and VPS are the output of the first stage which converts dual polarity inputs to a single polarity output which is fed to the second stage or comparator 12. The node VPS maximum voltage of +25 volts occurs when the transistor MP4 is rendered nonconductive. In this case, there will be no current flow through transistor MP4 and thus no current will flow through resistors R2 and R3. As such, the voltage at node VPS will be equal to the supply voltage VDDP25. For this embodiment, the supply voltage VDDP25 is +25 volts. The minimum node VPS voltage of approximately +1.5 volts occurs when the transistor MP4 is rendered fully conductive. This will cause sufficient current to flow through transistor MP4 such that the voltage across resistor R2 will be equal to approximately 23.5 volts. Thus, a voltage of approximately +1.5 volts will be established at node VPS.

The circuit composed of transistor MP24, resistor R10, and current source I1 is used to provide a source of voltage bias to the drain of transistor MP4 so that transistor MP4 is protected from experiencing excessive drain-to-source voltage or drain-to-backgate voltage that would exceed the break down voltages specific to the transistor. The current through current source I1 is controlled so that it is linearly related to the input signal voltage VP such that if the voltage at VP increases, the current I1 will also be increased, and if the voltage at VP decreases, the current I1 will be decreased. The circuitry to establish this relationship between current I1 and voltage VP is not shown in FIG. 1a. By increasing the current I1, the voltage at node A will be increased. This increase in voltage at node A is applied to the gate of transistor MP24, causing the transistor to become less conductive. This will in turn cause the voltage at node C (drain of MP4) to be increased. When VP goes high, the voltage on VPS (backgate of MP4) and the voltage on node E (source of MP4) will also go high, but at the same time I1 will increase and force node C (drain of MP4) to go high. That way the voltage VDS across drain-to-source of MP4 and the voltage from drain-to-backgate VDB of MP4 will be limited and will not exceed the maximum allowable voltage. For this embodiment, the maximum allowable drain-to-source and drain-to-backgate voltage is 30 volts. Thus the circuit composed of transistor MP24, resistor R10 and current source I1 acts to protect transistor MP4 from experiencing voltage breakdown.

The input voltage signal VN is applied to the gate of transistor MP8. MP8, R5 and R4 form a source follower circuit such that the voltage at the source of transistor MP8 will be a VGS voltage (approximately 1 to 3 volts) above VN and will follow (track) the voltage VN applied to the gate of MP8 and vary from +25 volts when VN is close to +25V to approximately −22V volts when VN is at −25V. The source of transistor MP8 is connected to the resistor R4 at node F. The resistors R4 and R5 are identical and are connected in series to act as a voltage divider. Since the voltages applied to VP and VN are close to each other the output voltages of the first stage VPS and VNS will also be close to each other and no electrical current will flow through diodes D0 or D1. That way, the resistor divider formed by R4 and R5 will make the voltage on VNS to be a half way between supply VDDP25 and the voltage on node F. The maximum voltage that may appear at node VNS is +25 volts when VN is +25 volts and the minimum voltage that may appear at node VNS is approximately +1.5 volts when VN is at −25 volts. The resistor divider is used to provide a positive voltage at VNS independent of the polarity of the input voltage VN. FIG. 3 depicts the dual polarity input voltages VP and VN and output signals VNS and VPS which are always positive. The nodes VNS and VPS are the output of the first stage which converts dual polarity inputs to a single polarity output which is fed to the second stage or comparator 12. The node VNS maximum voltage of +25 volts occurs when the transistor MP8 is rendered nonconductive. In this case, there will be no current flow through transistor MP8 and thus no current will flow through resistors R5 and R4. As such, the voltage at node VNS will be equal to the supply voltage VDDP25. For this embodiment, the supply voltage VDDP25 is +25 volts. The minimum node VNS voltage of approximately +1.5 volts occurs when the transistor MP8 is rendered fully conductive. This will cause sufficient current to flow through transistor MP8 such that the voltage across resistor R5 will be equal to approximately 23.5 volts. Thus, a voltage of approximately +1.5 volts will be established at node VNS.

The circuit composed of transistor MP26, resistor R11, and current source I2 is used to provide a source of voltage bias to the drain of transistor MP8 so that transistor MP8 is protected from experiencing excessive drain-to-source voltage or drain-to-backgate voltage that would exceed the break down voltages specific to the transistor. The current through current source I2 is controlled so that it is linearly related to the input signal voltage VN such that if the voltage at VN increases, the current I2 will also be increased, and if the voltage at VN decreases, the current I2 will be decreased. The circuitry to establish this relationship between current I2 and voltage VN is not shown in FIG. 1a. By increasing the current I2, the voltage at node B will be increased. This increase in voltage at node B is applied to the gate of transistor MP26, causing the transistor to become less conductive. This will in turn cause the voltage at node D (drain of MP8) to be increased. When VN goes high, the voltage on VNS (backgate of MP8) and the voltage on node F (source of MP8) will also go high, but at the same time I2 will increase and force node D (drain of MP8) to go high. That way the voltage VDS across drain-to-source of MP8 and the voltage from drain-to-backgate VDB of MP8 will be limited and will not exceed the maximum allowable voltage. For this embodiment, the maximum allowable drain-to-source and drain-to-backgate voltage is 30 volts. Thus the circuit composed of transistor MP26, resistor R11 and current source I2 acts to protect transistor MP8 from experiencing voltage breakdown.

When the input voltages VP and VN are both too high, close to the supply VDDP25, there will be no current flowing through R2, R3, R4, R5 and VPS and VNS will be at a voltage equal to the supply VDDP25. Since both VPS and VNS are at the same potential, the comparator 12 might make the wrong decision about the comparison of the two voltages. Therefore when both VP and VN are close to the rail VDDP25 the comparator is not guaranteed to operate correctly. This can be noted on FIG. 2 at around time zero. However, even is this scenario there is no risk for any breakdown to occur.

Figure 1B:
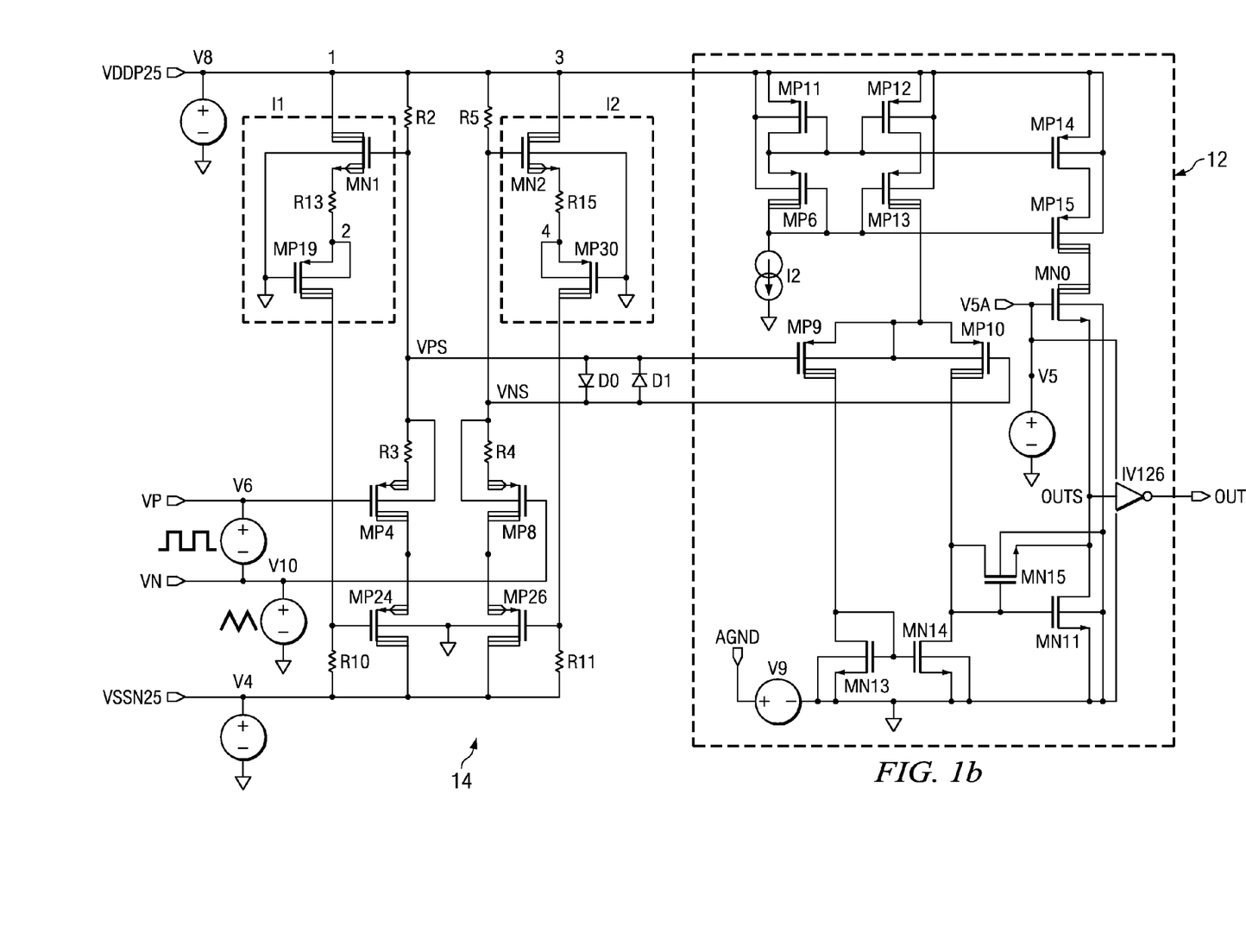
FIG. 1b illustrates a more detailed circuit of FIG. 1a in accordance with an exemplary embodiment of the present invention.

FIG. 1b shows an example of the implementation of current sources I1 and I2, as well as an example of the implementation of comparator 12. Transistor MN1, MP19 and resistor R13 form the current source I1. MN1 is a symmetric drain extended NMOS and MP19 is an asymmetric drain extended PMOS. When the voltage on VP goes high, the voltage on VPS goes high as well. The transistor MN1 and resistor R13 form a source follower configuration and when the gate voltage (VPS) goes high the source node 1 of MN1 goes high as well. The transistor MP19 has its gate connected to gnd, so the source node 2 of MP19 will be at an almost constant voltage potential of 1 to 1.5 volts (VGS of MP19). Since the voltage on node 1 moves up or down in a linear function of VP and the node 2 almost does not move, then the voltage and current across resistor R13 increases when VP goes high and decreases when VP goes low. Due to the connection of R13, MP19 and R10, the current that goes through R13 is the same as the current through R10, which represents I1 in FIG. 1a. Similarly, transistor MN2, MP30 and resistor R15 form the current source I2. MN2 is a symmetric drain extended NMOS and MP30 is an asymmetric drain extended PMOS. When the voltage on VN goes high, the voltage on VNS goes high as well. The transistor MN2 and resistor R15 form a source follower configuration and when the gate voltage (VNS) goes high the source node 3 of MN2 goes high as well. The transistor MP30 has its gate connected to gnd, so the source node 4 of MP30 will be at an almost constant voltage potential of 1 to 1.5 volts (VGS of MP30). Since the voltage on node 3 moves up or down in a linear function of VN and the node 4 almost does not move, then the voltage and current across resistor R15 increase when VN goes high and decrease when VN goes low. Due to the connection of R15, MP30 and R11, the current that goes through R15 is the same as the current through R11, which represents I2 in FIG. 1a.

FIG. 1b also shows an example of an implementation of the comparator 12. Transistors MP9, MP10, MN13, and MN14 are connected in a differential amplifier configuration. If VPS becomes less than voltage VNS, the voltage at the drain of MN14 will decrease, eventually reaching the ground potential. Transistor MN11 goes off forcing the voltage on node OUTS to go high. If VPS becomes greater than VNS, the voltage at the drain of MN14 will increase, forcing MN11 to be more conductive and bringing node OUTS to a low voltage potential. Transistors MN13 and MN14 form a current mirror so that the total current through MP9 and MP10 is constant. The bias current to the differential amplifier is provided by the current source composed of transistors MP11, MP6, MP12, and MP13. Transistors MN0, MN11, MP14 and MP15 form the output stage of comparator 12. MN0 limits the voltage level on node OUTS to be compatible with input of inverter IV120, which in turn translates the voltage level on OUTS to a 5 volts digital signal at the output OUT.

Figure 4:
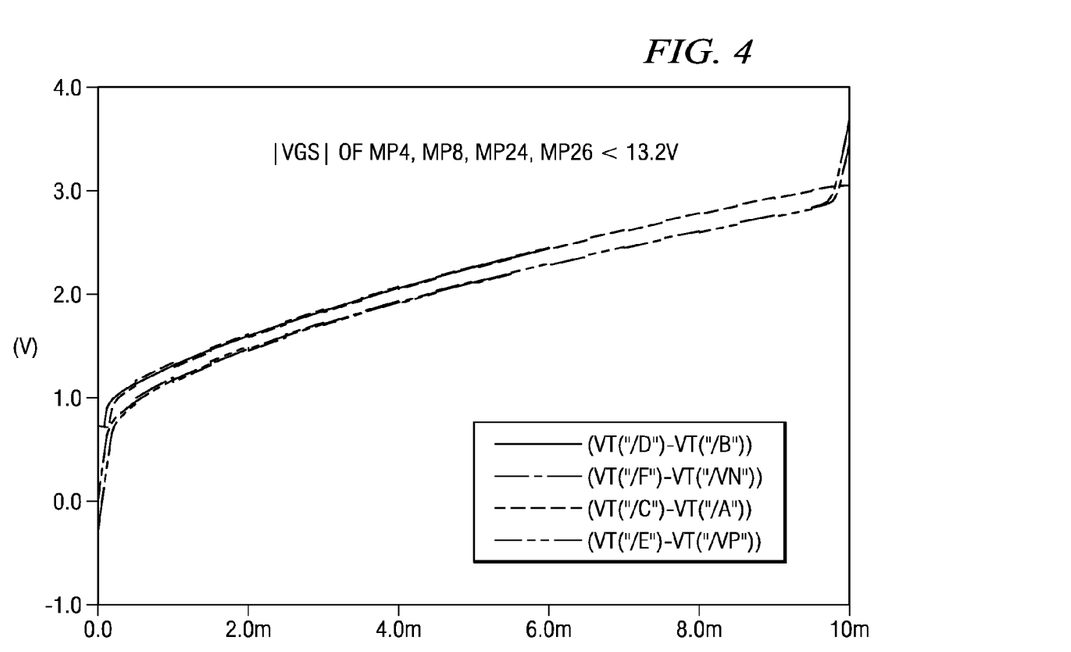
FIG. 4 illustrates a graph depicting the gate-to-source voltage VGS of the four PMOS transistors of the input stage not exceeding its maximum of 13.2 volts in accordance with an exemplary embodiment of the present invention.
Figure 5:
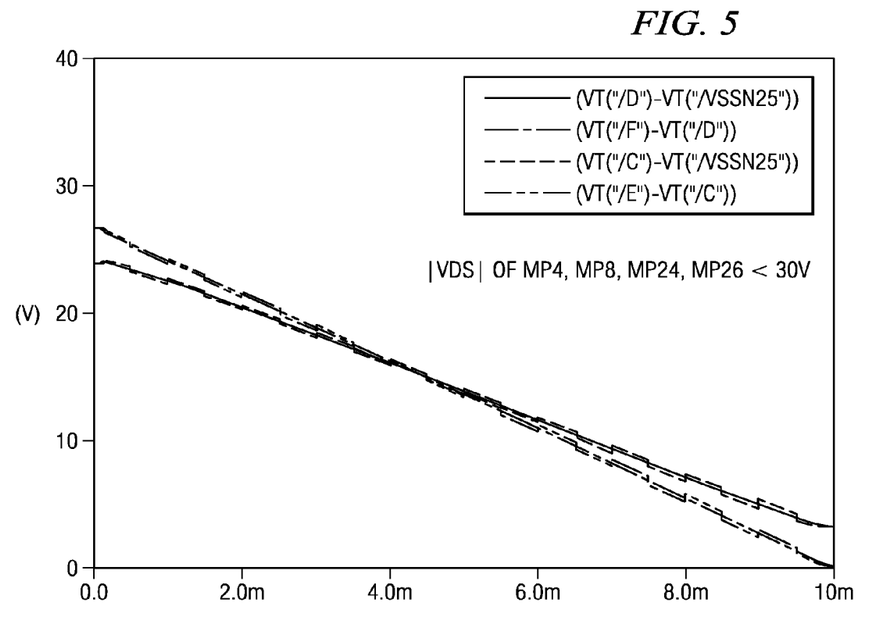
FIG. 5 illustrates a graph depicting the drain-to-source voltage VDS of the four PMOS transistors of the input stage not exceeding its maximum of 30 volts in accordance with an exemplary embodiment of the present invention.
Figure 6:
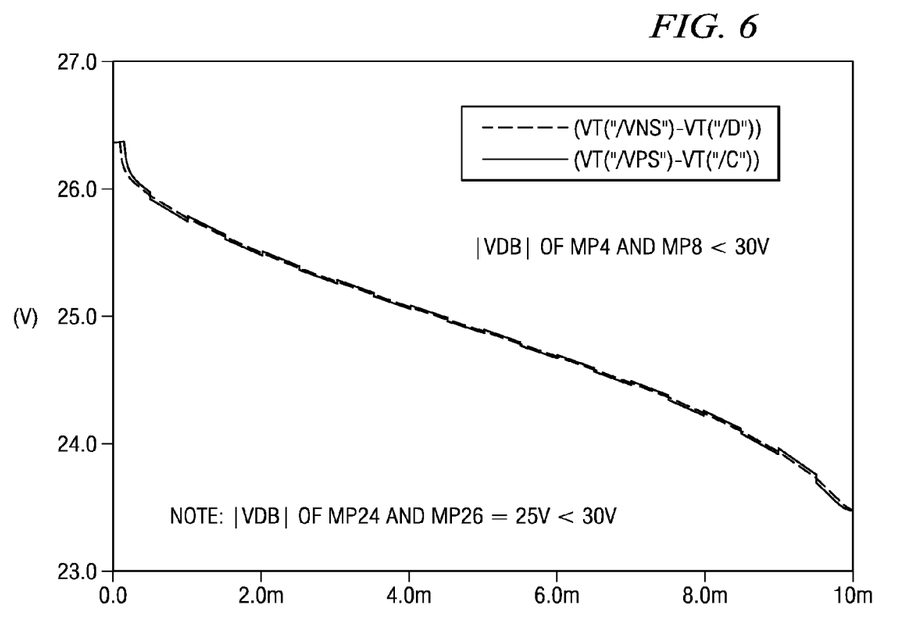
FIG. 6 illustrates a graph depicting the drain-to-backgate voltage VDB of the four PMOS transistors of the input stage not exceeding its maximum of 30 volts in accordance with an exemplary embodiment of the present invention.

FIGS. 4–6 show the voltages across the PMOS transistors MP4, MP8, MP24 and MP26 of the circuit shown in FIG. 1b when the input signals VP and VN are according to the waveform depicted in FIG. 2. As shown, they do not exceed the breakdown voltages of the devices. In FIG. 4, the VGS (gate to source) of the transistors MP4, MP8, MP24, and MP26 is depicted not exceeding its maximum of 13.2 volts and is actually shown to be far below such a breakdown voltage. In FIG. 5, signal VDS (drain to source) of the transistors MP4, MP8, MP24, and MP26 is depicted not exceeding its maximum of 30 volts and in FIG. 6, signal VDB (drain to backgate) of the transistors MP4 and MP8 is depicted not exceeding its maximum of 30 volts. Further, the drain to backgate voltage of MP24 and MP26 is at a fixed 25 volts.

When high swing voltages are applied to VP and VN, such that a high differential voltage exists across VP-VN, a high voltage will appear across the output voltages of input stage VPS and VNS. This will cause D0 or D1 to conduct current and clamp the voltage across VPS-VNS to less than 1 volt. Transistors MP4 or MP8 might become nonconductive (go OFF). For example, if the voltage on VP is much higher than on VN, the current that flows through R2 will go to D0 and then to VNS and no current will go through R3 and MP4 (MP4 would go OFF). The diodes D0 and D1 are used to protect the input transistors (MP9 and MP10 of FIG. 1b) of the comparator block 12 from experiencing voltages greater than the comparator input transistors can tolerate. The comparator positive and negative inputs are connected to the gate of MOS transistors which have gate-to-source and gate-to-drain breakdown voltages of 13.2 volts. The diodes D0 and D1 placed across the positive and negative inputs of comparator 12 limits the voltage of these inputs such that they cannot become greater than +13.2 volts or less than −13.2 volts. In other embodiments, the minimum and maximum breakdown voltages may differ.

Figure 7A:
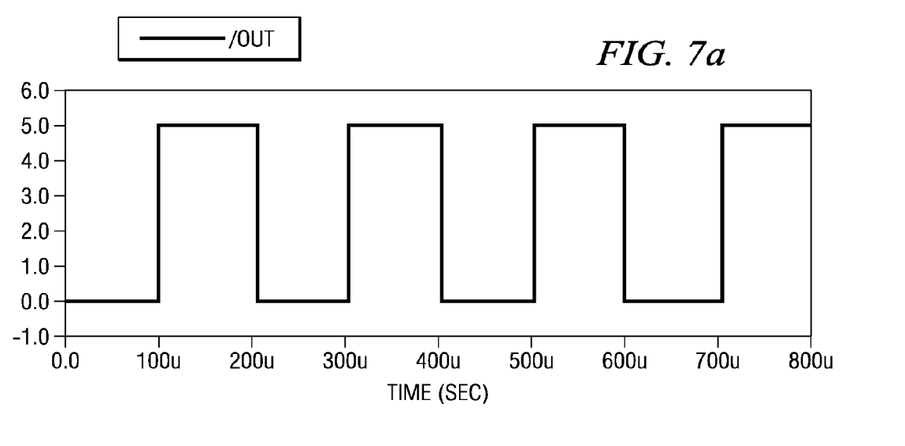
FIG. 7 illustrates a graph depicting input signals VP, VN at high swing voltages (high overdrive voltage at the input) and the comparator output voltage, in accordance with an exemplary embodiment of the present invention.
Figure 7B:
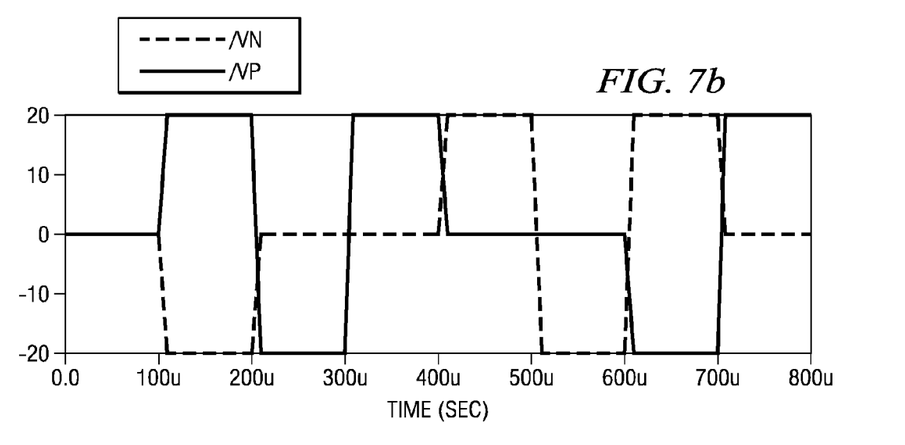

The situation where high swing voltages are applied to VP and VN inputs of circuit shown in FIG. 1b is depicted on FIGS. 7–13. FIG. 7 shows the input signal VP and VN swinging from 0V, +20V and −20V according to the indicated waveform. From 0 s to 100 us VP and VN are close to 0V with VP just a few millivolts below VN. The signal VOUT is the digital output of the comparator 12. VOUT is high (for example 5V) whenever VP is higher than VN and VOUT is low whenever VP is lower than VN.

Figure 8A:
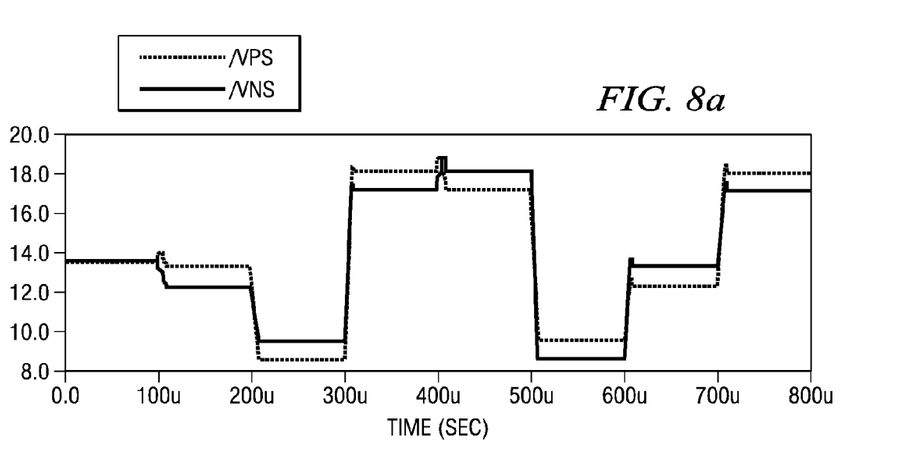
FIG. 8 illustrates a graph depicting input signals VP, VN and positive output signals of the input stage VPS, VNS in accordance with an exemplary embodiment of the present invention.
Figure 8B:
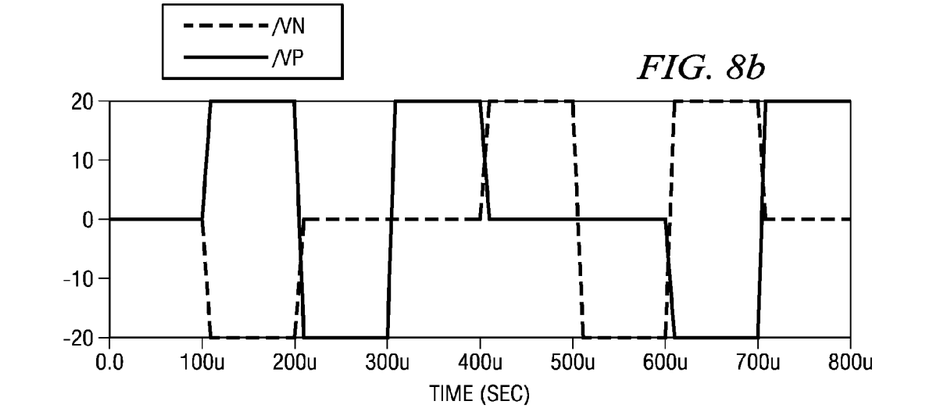

Referring now to FIG. 8, input signals VP and VN are similarly depicted as in FIG. 7 and the output signals VPS and VNS of the first stage are shown to be positive for receipt by the comparator 12. It can be noticed that the voltage across VPS-VNS never exceeds 1V due to the voltage clamp function performed by D0 and D1.

Figure 9A:
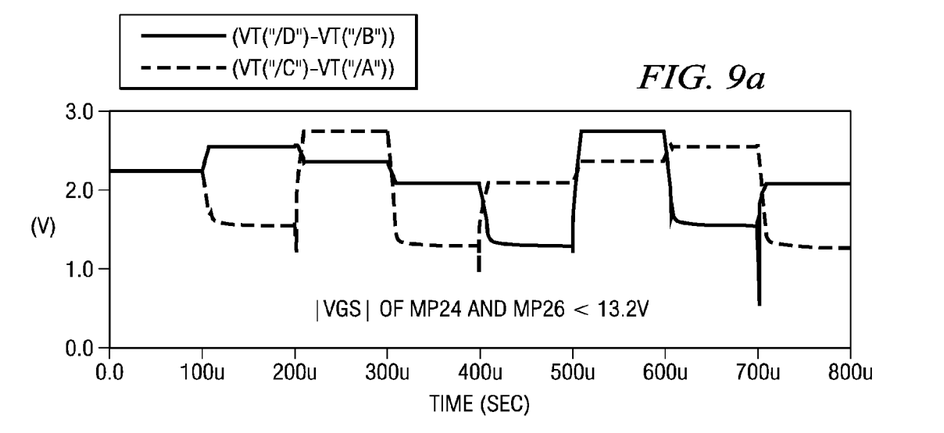
FIG. 9 illustrates a graph depicting the gate-to-source voltage VGS of the four PMOS transistors of the input stage not exceeding its maximum of 13.2 volts in accordance with an exemplary embodiment of the present invention.
Figure 9B:
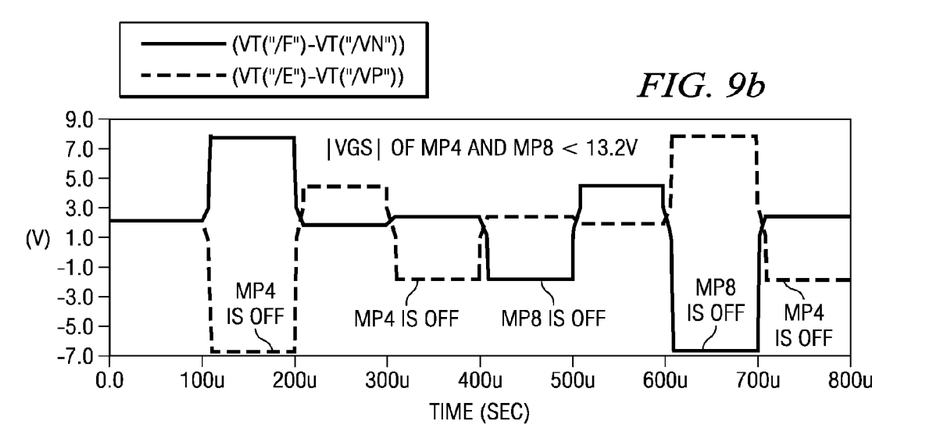

Referring now to FIG. 9, signal VGS of transistors MP4 and MP8 as well as signal VGS of transistors MP24 and MP26 are depicted as not exceeding its maximum of 13.2 volts even when the transistors are on and/or off.

Figure 10A:
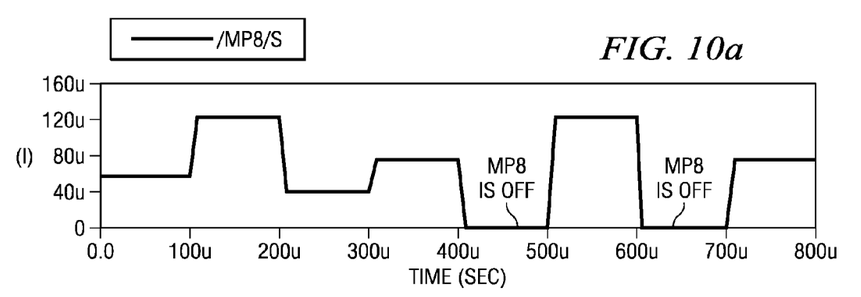
FIG. 10 illustrates a graph depicting the electrical current through transistor MP8 and the gate-to-source voltage VGS and gate-to-backgate voltage VGB of transistor MP8 when MP8 is on and off in accordance with an exemplary embodiment of the present invention.
Figure 10B:
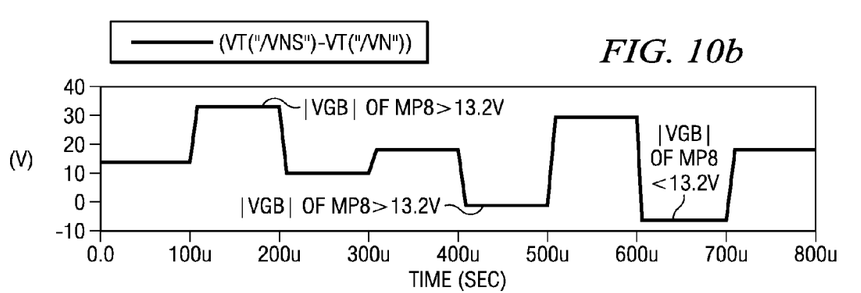
Figure 10C:
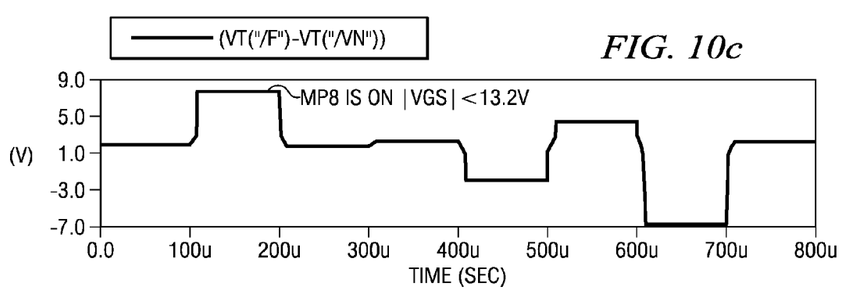

Referring now to FIG. 10, various graphs are depicted. The top graph shows the current through transistor MP8 and the intervals where that current goes to 0 indicating MP8 is OFF. In both occurrences when MP8 is OFF, the gate-to-backgate voltage of MP8 does not exceed the breakdown voltage of the gate oxide which is 13.2V. That means that even though there is no channel formed since MP8 is OFF, the voltage across the gate oxide will be no greater than the gate-to-backgate voltage and will not exceed the 13.2V. However, as can be seen in the middle graph, there is an occurrence between 100 us to 200 us when MP8 is ON and the gate-to-backgate voltage VGB of MP8 is higher than 13.2 volts. This is not a concern because at that time MP8 is ON, the MOS channel is formed and the voltage across the gate oxide will be dictated by the gate-to-source voltage VGS of the transistor. As can be seen in the bottom graph, the VGS of MP8 at that time is lower than the gate oxide breakdown voltage of 13.2 volts. Since the VGS is lower than 13.2 volts, and since the VGB is less than 13.2 volts when MP8 is off, this is not a problematic situation.

Figure 11A:
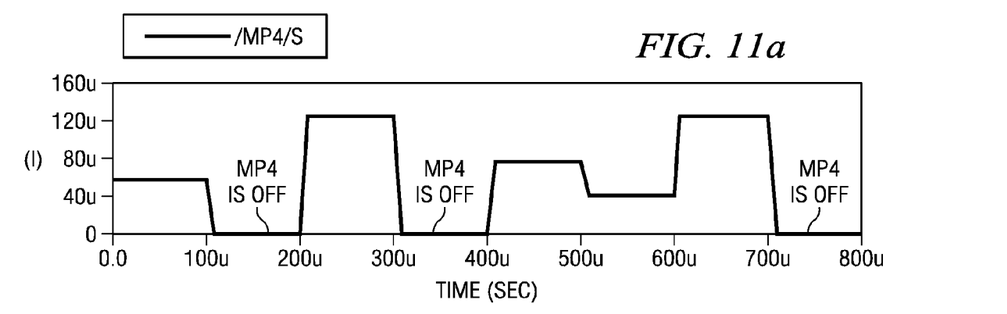
FIG. 11 illustrates a graph depicting the electrical current through transistor MP4 and the gate-to-source voltage VGS and gate-to-backgate voltage VGB of transistor MP4 when MP4 is on and off in accordance with an exemplary embodiment of the present invention.
Figure 11B:
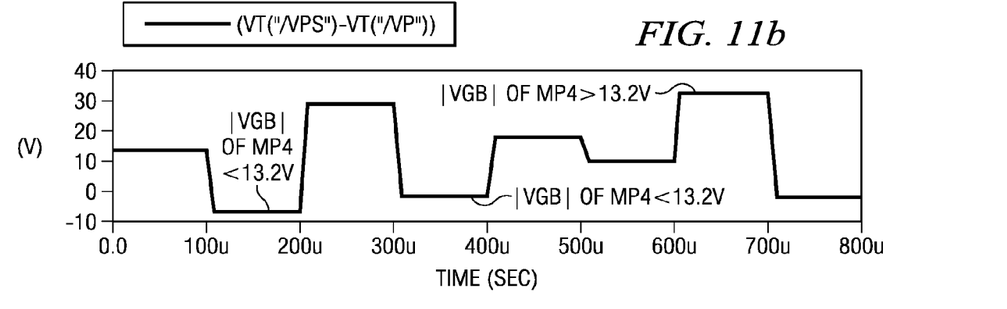
Figure 11C:
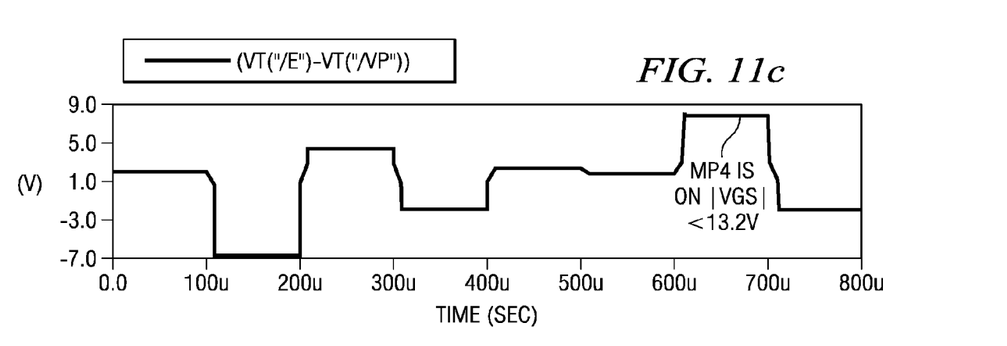

Referring now to FIG. 11, the waveforms show the similar situation for transistor MP4 as described in FIG. 10 for transistor MP8. When transistor MP4 is ON and the VGB of MP4 is higher than 13.2 volts, at the same time, the VGS of MP4 is lower than 13.2 volts preventing the voltage across the gate oxide of the transistor to be exceeded.

Figure 12:
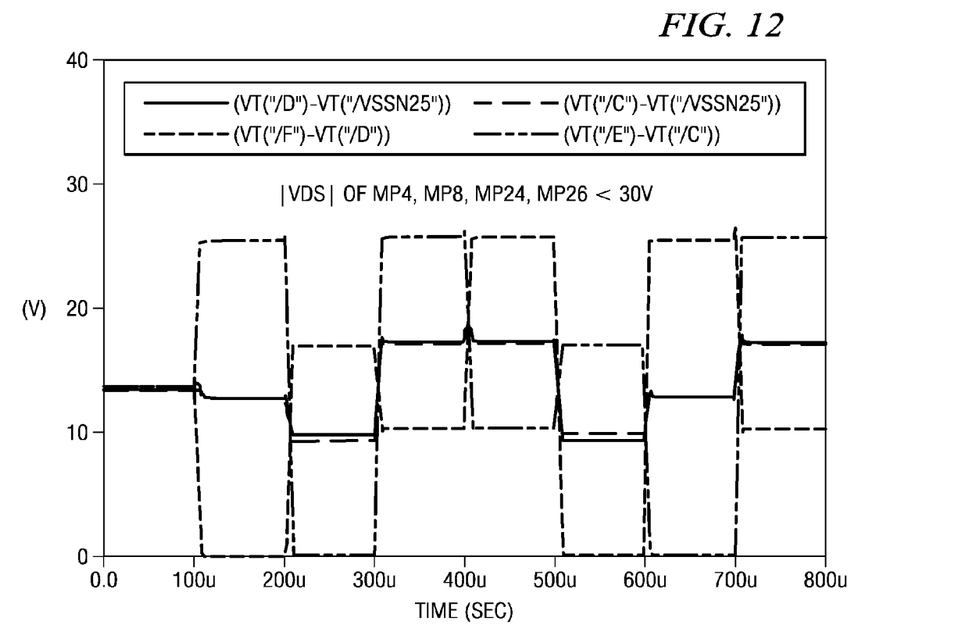
FIG. 12 illustrates a graph depicting the drain-to-source voltage VDS of the four PMOS transistors of the input stage not exceeding its maximum of 30 volts in accordance with an exemplary embodiment of the present invention.

Referring now to FIG. 12, the drain-to-source signal VDS of transistors MP4, MP8, MP24, and MP26 is depicted not exceeding its maximum of 30 volts.

Figure 13:
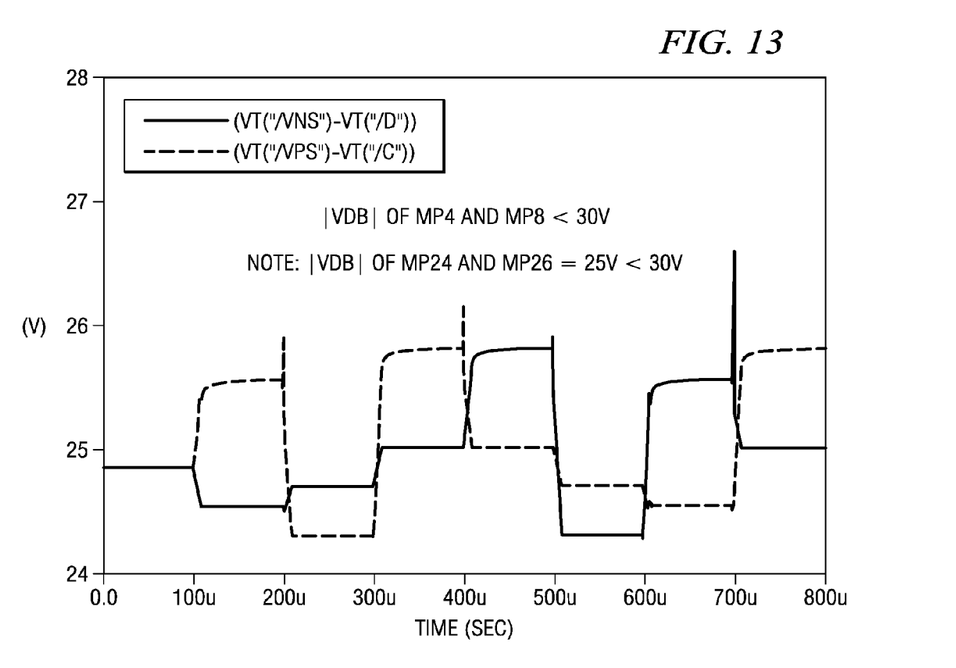
FIG. 13 illustrates a graph depicting the drain-to-backgate voltage VDB of the four PMOS transistors of the input stage not exceeding its maximum of 30 volts in accordance with an exemplary embodiment of the present invention.

Referring now to FIG. 13, the drain-to-backgate signal VDB of transistors MP4 and MP8 is depicted not exceeding its maximum of 30 volts. Further, the drain to backgate voltage of MP24 and MP26 is at a fixed 25 volts.

Although an exemplary embodiment of the present invention has been illustrated in the accompanied drawings and described in the foregoing detailed description, it will be understood that the invention is not limited to the embodiments disclosed, but is capable of numerous rearrangements, modifications, and substitutions without departing from the spirit of the invention as set forth and defined by the following claims.

What is claimed is:

1. A comparator circuit for processing dual input voltages, the comparator circuit comprising:
    an input stage comprising follower circuits, each having a source output node, a drain node and an input gate node adapted to receive one of the dual input voltages; the follower circuits adapted to output follower output voltages on the source output nodes;
    a comparator having a pair of comparator input nodes coupled to the respective source output nodes;
    a voltage clamp circuit coupled between the pair of comparator input nodes;
    the input stage further comprising bias circuits, each adapted to generate a bias voltage at the drain node of the respective follower circuit, responsive to the follower output voltage on the source output node.

2. The comparator circuit of claim 1, wherein the bias circuits couple to respective follower circuits configured to form a closed loop; and the closed loop is adapted to adjust the bias voltage.

3. The comparator circuit of claim 1, wherein each of the follower circuits comprises a follower transistor having a source and a backgate.

4. The comparator circuit of claim 3, wherein each of the follower circuits further comprises a resistor coupled between the source and the backgate of the follower transistor.

5. The comparator circuit of claim 1, wherein the voltage clamp circuit comprises a pair of diodes; respective anodes of the pair of diodes coupled to respective cathodes of the pair of diodes; and each of the pair of diodes coupled between the pair of comparator input nodes.

6. The comparator circuit of claim 1, wherein the bias circuits couple to respective follower circuits configured to form a closed loop; the voltage clamp circuit comprises a pair of diodes; respective anodes of the pair of diodes coupled to respective cathodes of the pair of diodes; each of the pair of diodes coupled between the pair of comparator input nodes; each of the follower circuits comprises a follower transistor having a source and a backgate; and each of the follower circuits further comprises a resistor coupled between the source and the backgate of the follower transistor.

7. A comparator circuit for processing dual input voltages, the comparator circuit comprising:
an input stage comprising follower circuits having source output nodes, drain nodes and input gate nodes adapted to receive the dual input voltages;
a comparator having a pair of comparator input nodes coupled to the source output nodes;
a voltage clamp circuit coupled between the pair of comparator input nodes;
first and second supply nodes; and
the input stage further comprising bias circuits, coupled between the first and second supply nodes, and each having a bias input node and a bias output node; the bias input node coupled to the source output node of the respective follower circuit and the bias output node coupled to the drain node of the respective follower circuit.

8. The comparator circuit of claim 7, wherein each of the follower circuits comprises a follower transistor having a source and a backgate.

9. The comparator circuit of claim 8, wherein each of the follower circuits further comprises a resistor coupled between the source and the backgate of the follower transistor.

10. The comparator circuit of claim 7, wherein the voltage clamp circuit comprises a pair of diodes; respective anodes of the pair of diodes coupled to respective cathodes of the pair of diodes; and each of the pair of diodes coupled between the pair of comparator input nodes.

11. The comparator circuit of claim 7, wherein each bias circuit comprises a resistive divider, a divider input node, a divider output node and first and second biasing transistors; the divider input node coupled to the source output node of the respective follower circuit; the divider output node coupled to the first biasing transistor; and the first biasing transistor coupled to the drain node of the respective follower circuit.

12. The comparator circuit of claim 11, wherein each of the second biasing transistors of the bias circuits comprises a control gate, a drain and a source; and wherein the drain couples to the first supply node, the source coupled to the respective resistive divider, the control gate coupled to the source output node of the respective follower circuit.

13. A method for comparing voltages, the method comprising tho steps of:
applying dual input voltages on input transistors, comprised in follower circuits, each of the follower circuits having an output source node, a drain node and a gate node;
adjusting a bias voltage on the drain node of each follower circuit, responsive to a voltage on the respective output source node and according to a first and second supply voltage; wherein the adjusting of the bias voltage is to keep the respective input transistor in the active region;
outputting a pair of signals from the input transistors to the output source nodes and then to a comparator circuit;
clamping the pair of signals with a clamp circuit when a differential voltage between the pair of signals is larger than breakdown voltages of transistors at inputs of the comparator circuit; and
generating an output from the comparator circuit responsive to the pair of signals.

14. The method of claim 13, wherein the adjusting maintains voltages that provide the gate nodes of the follower circuits with high impedance.

15. The method of claim 14, wherein the adjusting comprises use of closed feedback loops, each comprising a bias circuit and the respective follower circuit; whereby there are no additional external, off-circuit, components coupled to the gate nodes of the follower circuits.

16. The method of claim 15, wherein the adjusting further comprises generating a current through a resistive divider in each follower circuit, generating a control voltage to a transistor that generates the bias voltage.

17. The method of claim 13, wherein the dual input voltages are at least one of: both positive voltages; both negative voltages; one positive and one negative voltages; and zero voltages.

18. The method of claim 17, wherein the dual input voltages are very close to each other, whereby no clamping occurs.

19. The method of claim 17, wherein the dual input voltages are far apart from one another; and a voltage difference between the dual input voltages is greater than breakdown voltages of the follower transistor.

20. A method for comparing voltages, the method comprising the steps of:
applying dual input voltages on input transistors, comprised in follower circuits, each of the follower circuits having an output source node, a drain node and a gate node;
adjusting a bias voltage on the drain node of each follower circuit, responsive to a voltage on the respective output source node and according to a first and second supply voltage; wherein the adjusting of the bias voltage is to keep the respective input transistor in the active region;
outputting a pair of signals from the input transistors to the output source nodes and then to a comparator circuit;
clamping the pair of signals with a clamp circuit when a differential voltage between the pair of signals is larger than breakdown voltages of transistors at input of the comparator circuit;
generating an output from the comparator circuit responsive to the pair of signals; and
wherein the method further comprises a step of: shifting a voltage level of the dual input voltages to the output source nodes via input transistors coupled in series with respective resistors.

* * * * *